United States Patent
Kim et al.

(10) Patent No.: US 10,892,409 B2
(45) Date of Patent: Jan. 12, 2021

(54) SWITCHING DEVICE, METHOD OF FABRICATING THE SAME, AND NON-VOLATILE MEMORY DEVICE HAVING THE SAME

(71) Applicants: SK hynix Inc., Icheon (KR); Seoul National University R&DB Foundation, Seoul (KR)

(72) Inventors: Hyeong Joon Kim, Seongnam (KR); Ji Woon Park, Incheon (KR); Young Seok Kim, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/252,462

(22) Filed: Jan. 18, 2019

(65) Prior Publication Data

US 2019/0221739 A1   Jul. 18, 2019

(30) Foreign Application Priority Data

Jan. 18, 2018 (KR) .................. 10-2018-0006417

(51) Int. Cl.
*H01L 45/00* (2006.01)
*H01L 27/22* (2006.01)
*H01L 27/24* (2006.01)

(52) U.S. Cl.
CPC .......... *H01L 45/10* (2013.01); *H01L 27/224* (2013.01); *H01L 27/2409* (2013.01); *H01L 45/085* (2013.01); *H01L 45/1616* (2013.01); *H01L 45/1625* (2013.01); *H01L 45/1641* (2013.01); *H01L 45/1233* (2013.01); *H01L 45/14* (2013.01)

(58) Field of Classification Search
CPC . H01L 27/224; H01L 27/2409; H01L 45/085; H01L 45/10; H01L 45/1233; H01L 45/14; H01L 45/1616; H01L 45/1625; H01L 45/1641
USPC ............................................. 257/4
See application file for complete search history.

(56) References Cited

U.S. PATENT DOCUMENTS

| | | | |
|---|---|---|---|
| 9,373,786 B1 * | 6/2016 | Kamalanathan | ........ H01L 45/12 |
| 2005/0175901 A1 * | 8/2005 | Kawakami | ............... C22C 13/00 |
| | | | 429/231.95 |
| 2014/0291602 A1 * | 10/2014 | Kenyon | ................ H01L 45/145 |
| | | | 257/4 |
| 2017/0098683 A1 | 4/2017 | Ohba et al. | |
| 2017/0338279 A1 * | 11/2017 | Yang | ..................... H01L 27/224 |

FOREIGN PATENT DOCUMENTS

KR   1020160110375 A   9/2016

* cited by examiner

*Primary Examiner* — Duy T Nguyen

(57) ABSTRACT

The present invention relates to a switching device, a method of fabricating the same, and a nonvolatile memory device including the same. A switching device according to an embodiment of the present invention includes a first electrode; a second electrode; and a switching film which is disposed between the first electrode and the second electrode, and includes an electrically insulating matrix and a conductive path formed in the electrically insulating matrix. In this embodiment, the conductive path includes crystalline metal clusters dispersed in the electrically insulating matrix and a metal bridge connecting adjacent crystalline metal clusters.

16 Claims, 14 Drawing Sheets

SWITCHING DEVICE, METHOD OF FABRICATING THE SAME, AND NON-VOLATILE MEMORY DEVICE HAVING THE SAME

CROSS-REFERENCES TO RELATED APPLICATION

The present application claims priority under 35 U.S.C. 119(a) to the Korean application number 10-2018-0006417 filed on Jan. 18, 2018, which is herein incorporated by reference in its entirety.

BACKGROUND OF THE INVENTION

1. Field

The present invention relates to semiconductor technology, and more particularly, a switching device, a method of fabricating the same, and a nonvolatile memory device having the same.

2. Description of the Related Art

In recent years, the nonvolatile memory market is rapidly expanding as demand for portable digital applications such as digital cameras, MP3 players, and smart phones increases. As a programmable non-volatile memory device, a NAND flash memory is a typical example, and techniques such as a three-dimensional memory structure and a multi-level cell (MLC) are being actively developed to improve integration density. However, as NAND flash memory reaches the limit of scaling, as a new nonvolatile memory device which can replace the NAND flash memory by using a variable resistor capable of reversibly changing its resistance value, spin transfer torque magneto-resistive memory (STT-MRAM), resistive memory (ReRAM) and phase change random access memory (PCRAM) have been attracting attention as next generation memory devices.

In order to increase the integration density of next generation memory devices, the next generation memory devices are being developed to include array of a cross-point structure. However, there is a possibility that cross talk associated with memory write errors and read errors may be caused by a sneak current occurring between adjacent memory cells. To this end, research is being conducted to apply a switching device to a memory cell array. As such a switching device, a transistor, a diode, a tunnel barrier device, or an ovonic threshold switch has been proposed.

The switching device to be applied to the next-generation memory device requires no dependency of on-current on an electrode area and memory cell size, a low operating voltage, high on/off current ratio (Ion/off), cycling endurance, and high temperature stability.

SUMMARY OF THE INVENTION

A technological problem to be solved by the present invention is to implement a switching device of low power and high integration. The present invention provides a switching device having a low operating voltage, a high on/off current ratio (Ion/off), or high endurance against cycling or time lapse and stable operating characteristics at high temperatures.

Further, other technological problem to be solved by the present invention is to provide a method of fabricating a switching device having the above-mentioned advantages.

Further, another technological problem to be solved by the present invention is to provide a nonvolatile memory device including the above switching device having the above-described advantages.

A switching device according to an embodiment of the present invention may comprise a first electrode; a second electrode; and a switching film which is disposed between the first electrode and the second electrode, and includes an electrically insulating matrix and a conductive path formed in the electrically insulating matrix. The conductive path may include crystalline metal clusters dispersed in the electrically insulating matrix and a metal bridge connecting adjacent metal clusters.

In one embodiment, the metal bridge may have an amorphous structure. The metal bridge may provide a trap-limited conduction mechanism within the electrically insulating matrix. The constituent metal of the crystalline metal clusters and the metal bridge may comprise tellurium.

In one embodiment, the electrically insulating matrix may comprise oxides of a metal, a metalloid, or a non-metal, nitrides or combinations thereof. The metal, the metalloid or the non-metal of the electrically insulating matrix includes metal, metalloid or non-metal element which is thermodynamically more difficult to alloy with constituent metals of the crystalline metal clusters than coalescence or coagulation of the constituent metals. The electrically insulating matrix may include any one selected from silicon oxide, silicon nitride, and antimony oxide or combination thereof. The electrically insulating matrix may include silicon oxide, and the switching film may have a composition ratio according to $Te_xSI_yO_z$ ($0<x\leq1$, $0<Y\leq1$, $0\leq Z\leq1$). The electrically insulating matrix may include silicon nitride, and the switching film may have a composition ratio according to $Te_xSI_yN_z$ ($0<x\leq1$, $0<Y\leq1$, $0\leq Z\leq1$). The electrically insulating matrix may include antimony oxide, and the switching film may have a composition ratio according to $Te_xSB_yO_z$ ($0<x\leq10$, $0<Y\leq10$, $0\leq Z\leq10$).

In one embodiment, the doping concentration of the constituent metal of the metal clusters and the metal bridge may be in the range of 20 at. % to 30 at. %.

In one embodiment, the thickness of the switching film may be in the range of 80 nm to 400 nm. The switching film may have a conductive mechanism according to a trap-limited conduction model.

In one embodiment, wherein at least any one of the first electrode and the second electrode may include any one selected from the group consisting of titanium Ti, tantalum Ta, copper Cu, aluminum Al, nickel Ni, platinum Pt, palladium Pd, or rhodium Rh, tungsten W, silicon Si, TiN, TaN, $WSi_x$, $NiSi_x$, $CoSi_x$, $TiSi_x$, a mixture including more than two elements of foregoing, an alloy thereof, or a laminate structure thereof.

A method of fabricating a switching device according to an embodiment of the present invention may include a step for forming a first electrode; a step for forming an electrically insulating matrix having a metal doped on the first electrode; and a step for forming a second electrode on the electrically insulating matrix.

In an embodiment, the metal may be doped in-situ during forming the electrically insulating matrix.

In one embodiment, the method of fabricating the switching device may further comprise a step for performing a heat treatment to form a metal cluster by cohering the doped metal.

In one embodiment, the doped metal forms dispersed metal clusters in the electrically insulating matrix, and a foaming process for forming a metal bridge connecting adjacent metal clusters may be further performed.

In one embodiment, the doping concentration of the metal may be in the range of 20 at. % to 30 at. %.

A nonvolatile memory device according to an embodiment of the present invention may include a first electrode may include, a second electrode, and a switching film disposed between the first electrode and the second electrode. The switching film may include an electrically insulating matrix and a conductive path formed in the electrically insulating matrix, and the conductive path may comprise a switching device including the crystalline metal clusters dispersed in the electrically insulating matrix, and a metal bridge connecting clusters and adjacent metal clusters; and a non-volatile memory element electrically connected in series to the switching device.

According to an embodiment of the present invention, a switching film including an electrically insulating matrix and a conductive path formed in the electrically insulating matrix is embedded. The conductive path is provided by the crystalline metal clusters that are dispersed within the electrically insulating matrix, and a metal bridge connecting adjacent metal clusters. Therefore, a stable non-linear resistance path can be provided in the electrically insulating matrix, and as a result, a switching device having a low operating voltage, high on/off current ratio (Ion/off), a high endurance against cycling or time lapse and stable operation characteristics at high temperature may be provided.

Further, according to another embodiment of the present invention, a method which can easily manufacture a switching device having the above-mentioned advantages may be provided.

Further, according to another embodiment of the present invention, a nonvolatile memory device requiring a low power consumption and having high integration and high reliability may be provided by implementing nonvolatile memory array using a switching device having the above-mentioned advantages.

DETAILED DESCRIPTION OF THE INVENTION

Figure 1A:
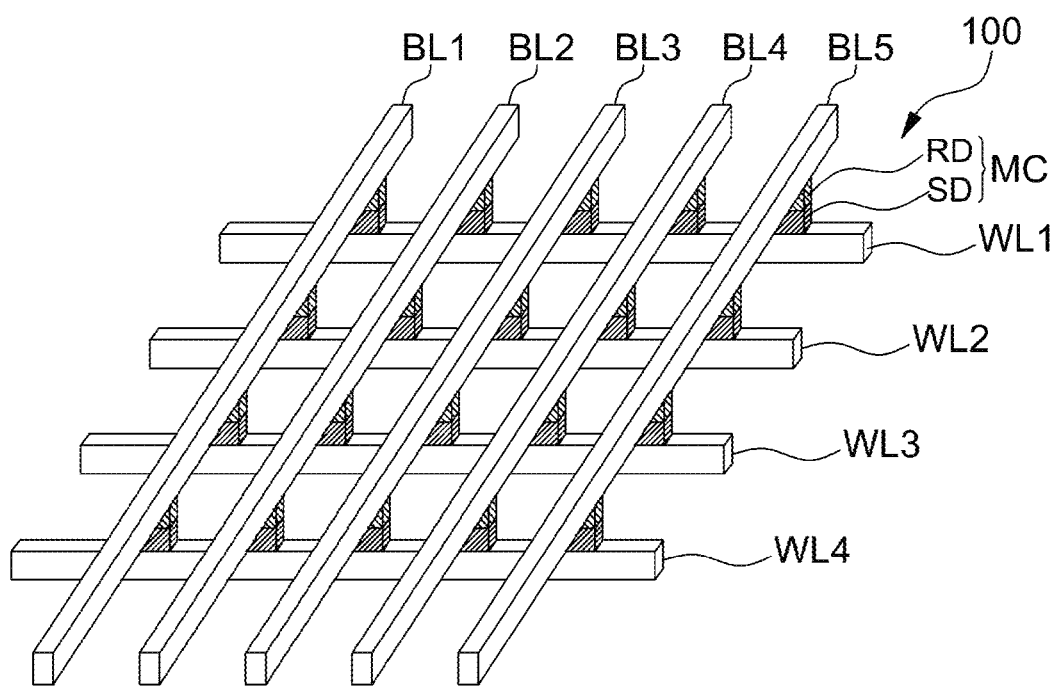
FIG. 1A illustrates a perspective view of a non-volatile memory device having a cross-point array in accordance with one embodiment of the present invention.

Hereinafter, preferred embodiments of the present invention will be described in detail with reference to the accompanying drawings.

Embodiments of the present invention are provided to the person skilled in the art in order to explain the present invention more completely well. The following embodiments may be modified in various other forms, and the scope of the present invention is not limited to the following embodiments. Rather, these embodiments are provided so that this disclosure may be described more faithfully and completely, and may fully convey the concept of the invention to those skilled in the art.

Further, in the following drawings, the thickness and the size of each layer are exaggerated for convenience of description and clarity of explanation. The same reference numerals refer to the same elements in the drawings. As used herein, the term "and/or" includes any one of the listed items and all combinations of more than one item.

The terms used herein are used to illustrate embodiments and are not intended to limit the scope of the invention. Also, as used herein, a singular type may include plural forms unless the context clearly indicates the other cases. Further, "comprise" and/or "comprising" used in this specification should be interpreted as specifying the presence of mentioned shapes, numbers, steps, operations, members, elements, and/or groups thereof and does not exclude the presence or addition of other shapes, numbers, operations, members, elements, and/or groups thereof.

In this specification, reference herein to a layer formed "on" a substrate or other layer may refer to a layer formed directly on top of the substrate or other layer, or an intermediate formed on the substrate or other layer, or the layer formed on the intermediate layers. Further, it will also be understood by those skilled in the art that structures or shapes that are arranged in an "adjacent" manner to other features may have portions that overlap or are disposed below the adjacent features.

As used herein, the terms, "below," "above," "upper," "lower," "horizontal," or "vertical" may be used to describe the relationships between one constituting member, layer or regions, and other constituting members, layers or regions, as shown in the drawings. It should be understood that these terms are intended to encompass not only the directions indicated in the drawings but also other directions of the elements.

In the following, embodiments of the present invention will be described with referring to the cross-sectional diagrams schematically illustrating ideal embodiments and intermediate structures of the present invention. In these drawings, for example, the size and shape of the members may be exaggerated for convenience and clarity of explanation, and in actual implementation, variations of the illustrated shape may be expected. Accordingly, embodiments of the present invention should not be construed as limited to the specific shapes of the regions shown herein. In addition, reference numerals of members in the drawings refer to the same members throughout the drawings.

Figure 1B:
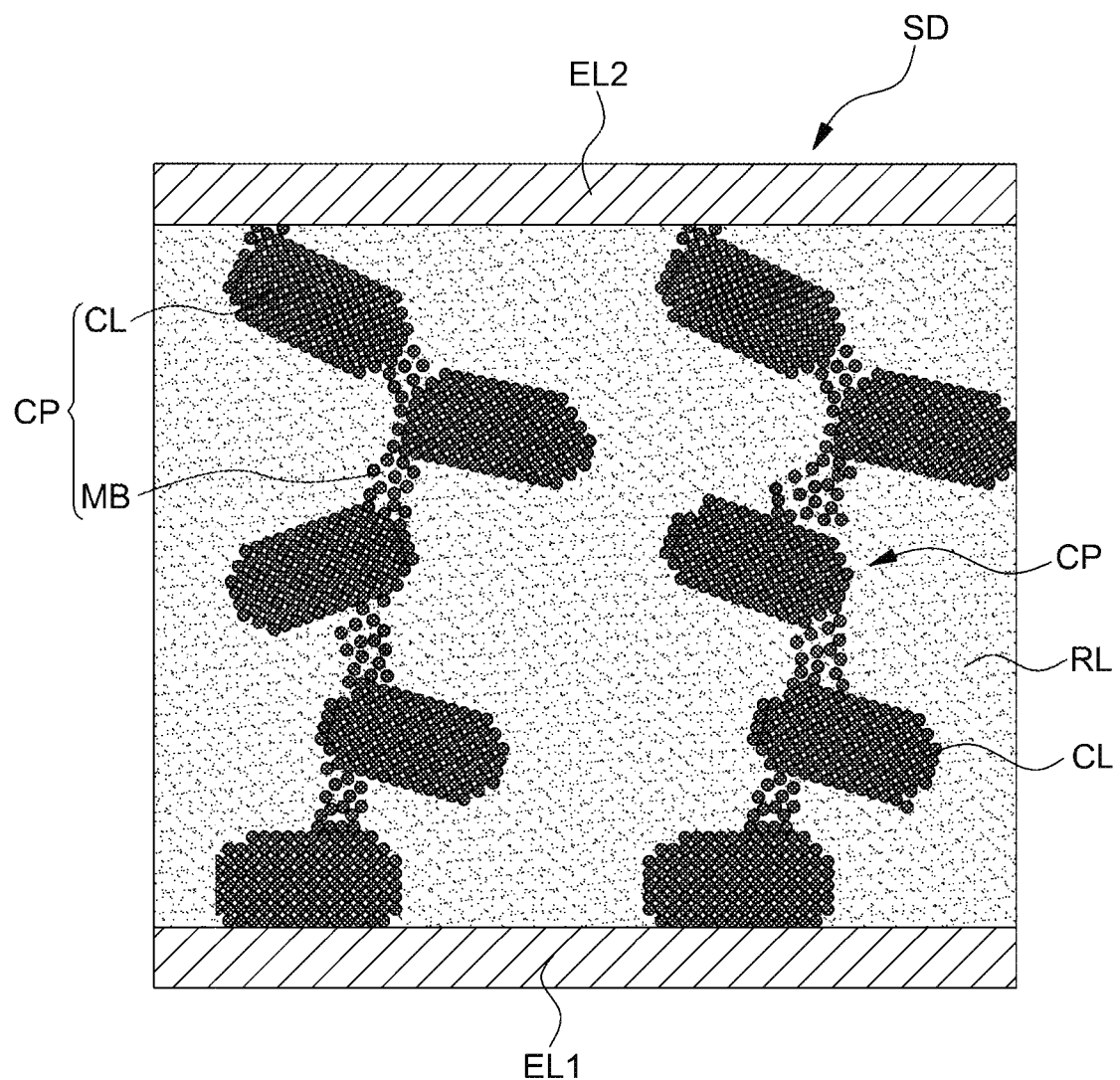
FIG. 1B illustrates a cross-sectional view of a switching device in accordance with one embodiment of the present invention.

FIG. 1A is a perspective view of a non-volatile memory device 100 including a cross-point array according to one embodiment of the present invention, and FIG. 1B is a cross-sectional view of a select device SD according to one embodiment of the present invention.

Referring FIG. 1A, a non-volatile memory device may include an array 100 of memory cells MC having a plurality of rows and columns. A set of first conductive electrodes WL1-WL4 are disposed on one side of the array of memory cells MC. In one embodiment, the first conductive electrodes WL1-WL4 may be word lines. Each of the word lines WL1 to WL4 may be electrically connected to the memory cells MC in the corresponding row. The other set of second conductive electrodes BL1-BL5 may be disposed on the other side of the array of memory cells MC. In one embodiment, the second conductive electrodes BL1-BL5 may be bit lines. Each of the bit lines BL1 to BL5 may be electrically connected to the memory cells MC in the corresponding column.

In the cross-point array 100, a memory cell MC may be disposed at each intersection of a word line and a bit line. The read and write operations of a particular memory cell (referred to as a selected memory cell) may be performed by activating the word line and bit line associated with the selected memory cell. The non-volatile memory device 100 may include a word line control circuit, for example, a row decoder that is coupled to the memory cells MC via respective word lines and activates the selected word lines for reading or writing a selected memory cell MC. The non-volatile memory device 100 may include a bit line control circuit, for example, a column decoder or page buffer that is coupled to the memory cells MC via respective bit lines BL1-BL5.

The word line control circuit and the bit line control circuit may selectively access a specific memory cell MC by activating the corresponding word and bit lines coupled to the selected memory cell MC. During a write operation, the word line control circuit may write information to the selected memory cell MC by applying a predetermined voltage to a selected word line. In this case, a logic value may be written to the selected memory cell MC while a current that influences the characteristics of the memory cell MC flows into the selected memory cell MC.

In one embodiment, each memory cell MC includes a variable resistor RD, and logical values may be stored by changing resistance values of the variable resistors RD. Multi-bit logical values may be stored according to a level of resistance, where different levels of resistance in a range of values represent respective values. The change in the resistance values may be detected through a read operation. The variable resistor RD may include a phase change material, a variable resistive material, a programmable metallization cell (PMC) material, a magnetic material, or a combination thereof. A forming process may form a reversible conductive path in memory cells in order to obtain a reversible resistance change. For example, when the variable resistor RD is a variable resistive material, a reversible conductive path such as a conductive filament may be formed. Switching may be performed by a reset process in which the variable resistor RD changes from a low resistance state LRS to a high resistance state FIRS, and the set process in which the variable resistance body RD changes from the high resistance state HRS to the low resistance state LAS by applying a voltage or a current. A logic value of "0" or "1" may be assigned to each resistance value level of the low resistance state LRS and the high resistance state HRS.

In one embodiment, when the variable resistor RD is a phase change material, the material may be reversibly converted from a non-crystalline state to a crystalline state or vice versa, where the material has different resistance values in crystalline and non-crystalline states. Embodiments of the phase change material include $GeSb_2Te_3$, $Ge_2Sb_2Te_5$, $GeSb_2Te_4$, GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, $GeTeSb_2$, $GeTe_3S_2$, GeSbTePd, AgInSbTe, and combinations of these materials. In an embodiment, the phase change material may be a chalcogenide-based compound such as the foregoing chalcogenides that is doped with a non-metal such as B, C, N and P. The above-described embodiments are merely illustrative, and the present invention is not limited thereto.

In one embodiment, when the variable resistor RD is a variable resistive material, the materials that may be reversibly converted between a low resistance state and a high resistance state according to an electrical signal include perovskite-based oxides such as $SrTiO_3$, $SrZrO_3$, and $Nb:SrTiO_3$ and transition metal oxides such as $TiO_x$, NiO, $TaO_x$, $HfO_x$, $AlO_x$, $ZrO_x$, $CuO_x$, $NbO_x$ and $TaO_x$, $GaO_x$, $GdO_x$, PrCaMnO, and $ZnONiO_x$.

In one embodiment, when the variable resistor RD is a programmable metallization cell, the variable resistor RD may include two metal electrodes. One metal electrode may have an electrochemically active metal such as oxidizable silver (Ag), tellurium (Te), copper (Cu), tantalum (Ta) or titanium (Ti), and the other metal electrode may be formed from a relatively inactive metal such as tungsten (W), gold (Au), platinum (Pt), palladium (Pd), and rhodium (Rh).An electrolyte material having superionic regions may be disposed between the electrifies. Resistance changes or switching characteristics are exhibited through physical rearrangement of superionic regions in the electrolyte material. The electrolyte material having the superionic regions may be, for example, a base glass material such as a germanium selenium compound GeSe material. The GeSe compound may also be referred to as a chalcogenide glass or a chalogenide material. Examples of GeSe compounds include $Ge_3Se_7$, $Ge_4Se_6$ and $Ge_2Se_3$. In other embodiments, other materials may be used.

In an embodiment in which the variable resistor RD is a magnetic material, the magnetic material may include Mg, Ni, CO, and/or Fe. In this case, a non-volatile information storage film pattern SM may be applied as a giant magnetoresistive GMR device and a tunneling magneto resistance MIR device. In particular, in the case of a tunneling magnetoresistive device, a nonvolatile information storage film pattern SM may include a magnetic tunneling junction with a laminated structure of a suitable insulating film together with a film made of these magnetic material materials.

The materials disclosed with respect to the above-described variable resistor RD are illustrative, and the invention is not limited thereto. In some embodiments, a variable resistor may be implemented as a plurality of material layers in which each material layer has a different composition from adjacent layers. There is still a level of uncertainty present in the understanding of various aspects or switching mechanism of the operation of variable resistor materials.

However, such uncertainty should not be imputed to the present application, which is supported by experimental data.

Embodiments of the present application include a variable resistor material that exhibits electrical hysteresis. The variable resistor may be a single layer of material, or a plurality of materials in a layered laminate structure. The resistance layer may have unipolar or bipolar switching characteristics. The variable resistor RD may be made of only a unipolar resistive material, or may be made of only a bipolar resistive material. Alternatively, the variable resistor RD may in a memory cell MC that performs multi-bit driving using a laminate structure of a film made of a unipolar resistance mated al and a film made of a bipolar resistance material.

For programming or reading the selected memory cell MC, the voltage or the width and/or the magnitude of a current pulse across the memory cell MC may be set so that the resistance value of the selected memory cell MC may be adjusted. Thus, a specific logic state may be written or read. Since a read operation may be affected by a sneak current generated by the memory cells MC adjacent to the selected memory cell MC, each memory cell MC may include a switching device SD connected to the variable resistor RD in series.

Referring FIG. 1B, the switching device SD may include a first electrode EL1, which may be referred to as a lower electrode, a second electrode EL2, which may be referred to as an upper electrode, and a switching film RL disposed between the first electrode EL1 and the second electrode EL2. The first electrode EL1 and the second electrode EL2 may be made of the same material or different materials. In one embodiment, the electrodes may include a reactive metal such as titanium (Ti), tantalum (Ta), copper (Cu), aluminum (Al) or nickel (Ni), and may also include platinum (Pt), gold (Au), and palladium (Pd) or rhodium (Rh), which have a large work function in order to form a Schottky barrier layer for the switching film (RL). However, the present invention is not limited to these specific materials. For example, the electrodes may include one or more inert metal such as tungsten (W), a conductive nitride such as TiN or TaN, or a conductive oxide such as $(InSn)_2O_3$. In another embodiment, the electrodes may comprise silicon Si or a silicon metal compound such as $WSi_x$, $NiSi_x$, $CoSi_x$ or $TiSi_x$. In various embodiments, the listed electrode materials may be mixed or alloyed, and more than two laminated electrode layers may be applied. In one embodiment, one of the first electrode EL1 and the second electrode EL2 of the switching device SD may be connected to the variable resistor RD of the memory cell MC, and the other electrode may be electrically connected to the word line or bit line, respectively. In one embodiment, an electrode which is connected to the word line or the bit line may be formed of the same material as the word line or the bit line to which it is connected, and the electrode and line may be integrated with each other. Further, an electrode connected to the variable resistor RD among the first electrode EL1 and the second electrode EL2 may function as one electrode of the memory cell MC.

In one embodiment, the switching film RL may comprise an amorphous matrix material MX that is an electrical insulator, and a plurality of metal clusters MC which are dispersed in the amorphous matrix MX. In one embodiment, the metal clusters MC may comprise tellurium, and in particular, the metal clusters MC may comprise tellurium clusters formed when tellurium doped in the matrix MX coalesces or agglomerates into discrete clusters. Tellurium is only one possible material, and in another embodiment, the constituent metal may be any metal element which is doped in the amorphous matrix MX is coalesced or agglomerated to be precipitated as a crystalline second phase.

In various embodiments, the amorphous matrix (MX) may be an amorphous nitride, an amorphous oxide, or a combination thereof (e.g., a laminated structure or a mixture). In an embodiment, the amorphous matrix MX may comprise any one or combination of silicon oxide, silicon nitride, and antimony oxide. However, this is merely exemplary, and as will be described later, in order to facilitate coalescence or coagulation of the metal atoms in the metal clusters formed by the doped metal in the amorphous matrix MX, the amorphous matrix MX may comprise electrically insulating oxides or nitrides of other metals, metalloids or non-metallic elements which are thermodynamically more difficult to be alloyed with the constituent metals than the coalescence or coagulation of the constituent metals. In other words, the matrix MX may comprise a material that tends to coalesce into a discrete phase when subjected to heat treatment instead of alloying with the matrix material. For example, the amorphous matrix MX may be an electrically insulating amorphous oxide or amorphous nitride containing aluminum, germanium, strontium, titanium, tantalum, niobium, zirconium, cadmium, calcium, or zinc.

In one embodiment, the doped metal in the matrix MX coalesce into discrete metal clusters CL in a crystalline state. Accordingly, the switching film RL may have a structure in which a metal clusters CL having a crystalline structure are dispersed in the amorphous matrix MX. The metal atoms may agglomerate to each other in situ when the doped metal is being deposited during the formation of the matrix MX, or the metal atoms are coalesced or agglomerated into clusters in the matrix MX by performing a heat treatment, thereby forming crystalline metal clusters CL. In a non-limiting embodiment, the heat treatment for forming the metal clusters CL having a crystalline structure may be performed, for example, at 200° C. or higher and 400° C. or lower. A resulting structure includes a matrix MX that has an amorphous structure overall and a plurality of discrete crystalline metal clusters CL.

The electrodes EL1 and EL2 have interfaces with the matrix MX of the amorphous structure. The interfaces may be uniformly formed over the entire electrode area, thereby avoiding an interface effect due to any crystal detects. As will be explained in more detail below, electrical performance of the switching device SD is largely independent of the surface area of the interface.

According to one embodiment, the switching film RL has a thickness in the range of 80 nm to 400 nm, and may preferably have a thickness in the range of 100 nm to 300 nm. In the above-mentioned thickness range, the switching film RL may form a reliable conductive path by controlling the concentration of the doped metal, to provide uniform performance between the memory cells for the threshold voltage switching drive. When the thickness of the switching film RL is less than 80 nm, excessive current may flow through the switching film RL during a process for forming a conductive path CP as described later with reference to FIG. 2A and FIG. 2B. In this case, the conductive bridge CP comprising metal clusters CL and metal bridges MB may be too large, or an excessive number of metal bridges MB may be formed so that the metal bridge MB may act as an irreversible complete conductor. As a result, threshold voltage switching may not be obtained from the switching film RL. Further, if the thickness of the switching film RL exceeds 400 nm, the current may not flow through the switching film RL so that metal bridges MB are not formed.

Therefore, the conductive path CP is not provided and the threshold voltage switching drive may not be obtained.

In one embodiment, the metal to be doped in the switching film RL may have a concentration in a range of 10 at. % to 40 at. % Preferably, the doped metal may have a concentration in a range of 20 at. % to 30 at. %. In one embodiment, the doped metal may comprise tellurium. If the concentration of the doped metal in the switching film RL is less than 10 at. %, the number or size of the metal clusters CL may decrease and accordingly, the number of the locally formed conductive paths CP may be reduced or may not be formed. In a material with lower doped metal concentration, even if the conductive paths CP are formed, weak conductive paths CP having a small cross-sectional area may be formed. In this case, in order to overcome this problem, the forming voltage to be described later is increased, so that the lifetime of the device may be reduced. When the tellurium doping concentration of the switching film RE exceeds 40 at. %, the size or the number of the metal clusters CL increases and the cross-sectional area of the locally formed conductive path CP is large or is densely formed. Therefore, this phenomenon may affect the operation voltage and prevent threshold voltage characteristics.

Figure 2A:
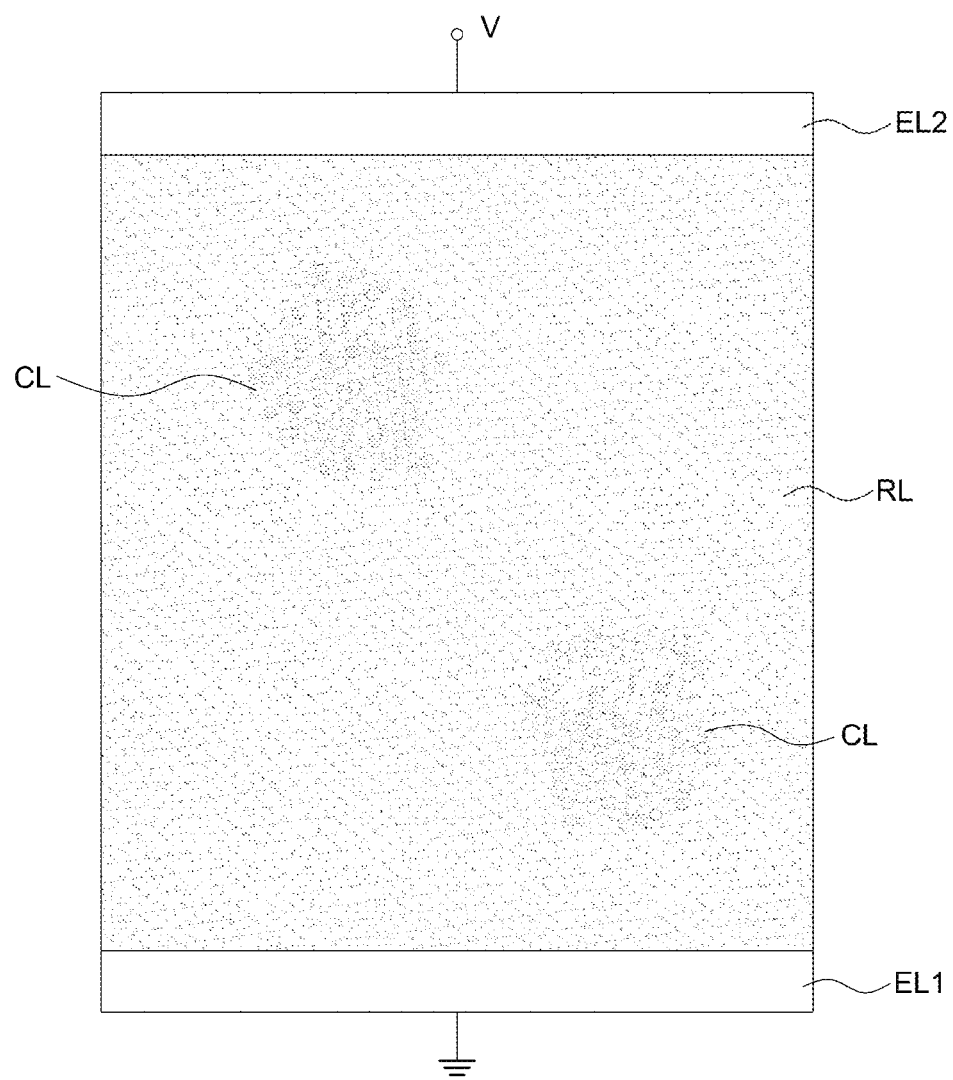
FIGS. 2A and 2B are cross-sectional views illustrating a mechanism of forming a conductive path for threshold voltage switching of a switching device according to an embodiment of the present invention.
Figure 2B:
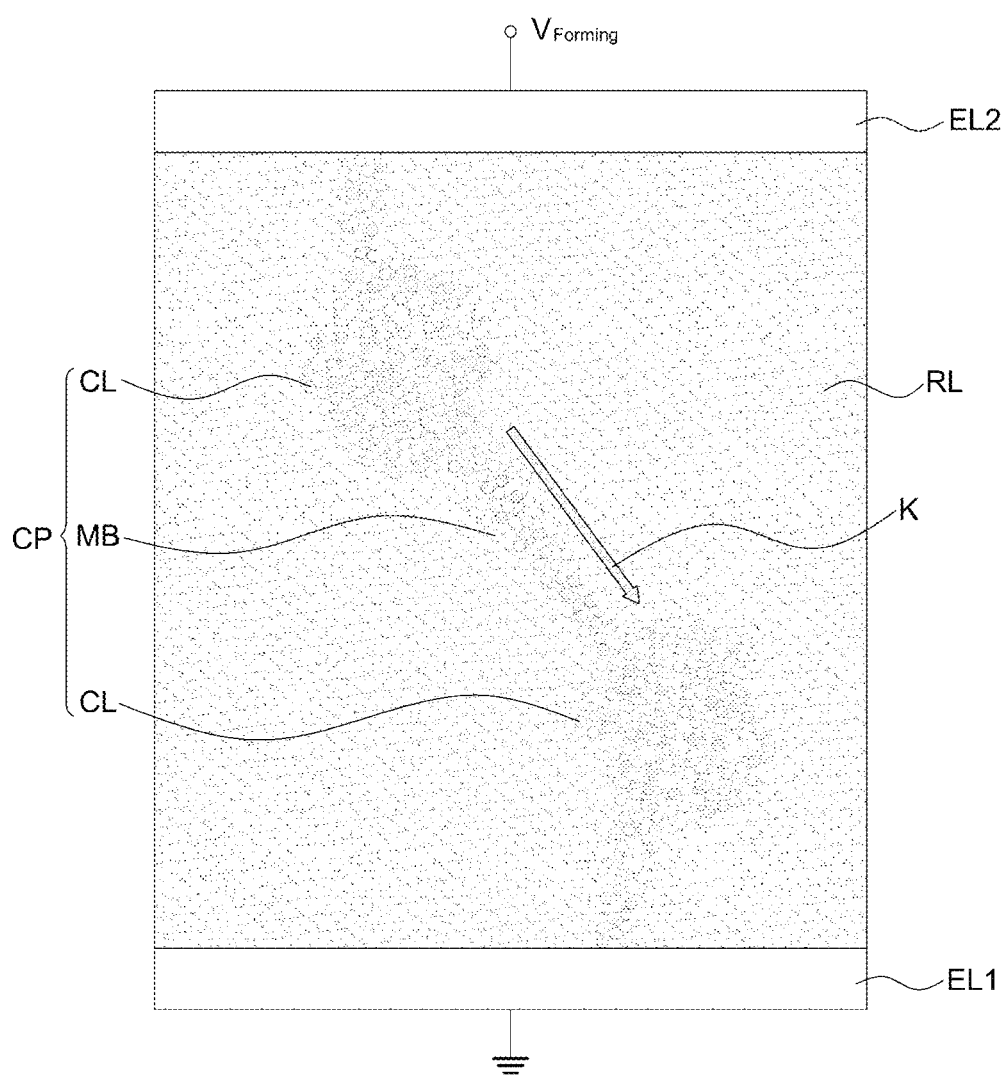

FIGS. 2A and 2B are cross-sectional views for explaining mechanisms for forming a conductive path for obtaining a threshold voltage of a switching device according to an embodiment of the present invention.

Referring to FIG. 2A, in the electrically insulating matrix MX of the switching film RL, metal clusters MC may be formed by the doped metal. Hereinafter, as illustrated in FIG. 2B, in one embodiment, when the first electrode EL1 is grounded and a forming voltage $V_{Forming}$ is applied to the second electrode EL2, a reversible conductive path CP such as a conductive filament may be formed in the matrix MX. The forming voltage $V_{Forming}$ causes electrical drill of the metal atoms between the adjacent metal clusters CL as indicated by arrows K so that a metal bridge MB connecting the metal clusters CL may be formed. The metal bridge MB is formed locally by electrical drift, unlike the metal clusters CL, and thus, the metal bridge MB may have an amorphous structure.

A switching device according to an embodiment of the present invention may have a high resistance in an off state since electrical current may flow by charges, that is, electrons only through deep traps in the matrix MX. However, when an operating voltage is applied to the second electrode EL2, the energy band structure may be bent, and electrons of the first electrode EL1 are tunneled into the band gap of the switching film RE and subsequently, the electrons move into shallow traps present in the vicinity of the conduction band. Then, while the electrons are travelling through the shallow traps TP2, the conductive current path may be multiplexed by the shallow traps as well as the deep traps, so that the switching device SD may be turned on. This trap-limited conduction model may implement the threshold voltage switching characteristics of the switching device in accordance with an embodiment of the present invention.

In an embodiment of the present invention, the metal clusters CL and the conductive path including the metal bridge MB connecting between the metal clusters CL may provide the trap sites that may form the above-mentioned conductive path in the electrically insulating matrix MX. In one embodiment, the trap sites may be provided by a metal bridge formed by a forming process. When an external voltage is initially applied to the switching device, the electrons are trapped at the trap site and the current flows according to the Poole-Frenkel conduction mechanism.

Therefore, threshold voltage switching may occur wherein the resistance value is high at an initial stage, and the resistance value becomes low when exceeding the threshold voltage.

Figure 3:
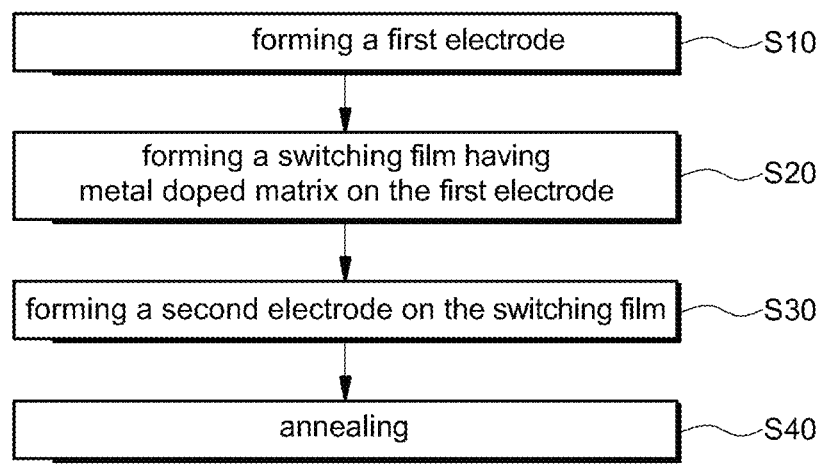
FIG. 3 illustrates a flow chart showing a method of fabricating a switching device according to an embodiment of the present invention.

FIG. 3 is a flow chart illustrating a method of fabricating a switching device SD according to an embodiment of the present invention.

Referring to FIG. 3, in order to manufacture the switching device SD, a lower electrode (which may be the first electrode EL1 in FIG. 1A) may be formed (S10). The lower electrode may be formed by sputtering, chemical vapor deposition or atomic layer deposition, and the present invention is not limited thereto.

Then, the switching film RL including the matrix MX doped with a metal, for example, tellurium, may be formed on the lower electrode (S20). In one embodiment, the switching film RL may be formed by doping metals in situ while forming the matrix MX through a deposition process such as sputtering, chemical vapor deposition, or atomic layer deposition, which is a self-limiting process. For example, in the case of a tellurium-doped silicon nitride film (Te:SiN), a silicon target and a tellurium target may be simultaneously co-sputtered under an $N_2$ gas atmosphere to form a matrix MX doped with tellurium. Alternatively, a tellurium-doped matrix MX may be formed via chemical vapor deposition or atomic layer deposition under a nitrogen atmosphere using a silicon-containing precursor and a tellurium-containing precursor.

In another embodiment, a switching film comprising a metal-doped matrix may be formed by sputtering under a nitrogen or oxygen atmosphere using a single target of metal-doped silicon in order to form a matrix with metal clusters. Further, in one embodiment a process such as plasma enhanced sputtering may be applied as an ion assist.

Thereafter, an upper electrode (second electrode EL2 of FIG. 1A) may be formed on the switching film RL (S30). The upper electrode may also be formed by sputtering or chemical vapor deposition. In one embodiment, after forming the laminated structure of the switching device SD having a lower electrode EL1, a switching film RL, and an upper electrode EL2, a heat treatment step may be further performed (S40). The heat treatment step may be performed under an inert atmosphere of, for example, Ar gas within a temperature range of 180° C. to 400° C. In one embodiment, the doped metal may be agglomerated by the heat treatment to form crystallized metal clusters. Further, in another embodiment of the present invention, the heat treatment step S40 may be performed after the forming step S20 of the switching film RL and before step S30 of forming the upper electrode.

Thereafter, a conductive path CP may be formed by applying a forming voltage to the switching device SD, and connecting between adjacent tellurium clusters IC with a metal bridge MB.

FIG. 4A to 4D are transmission electron microscope TEM images showing a cross section of a select element SD having a tellurium-doped matrix structure according to an embodiment of the present invention.

Figure 4A:
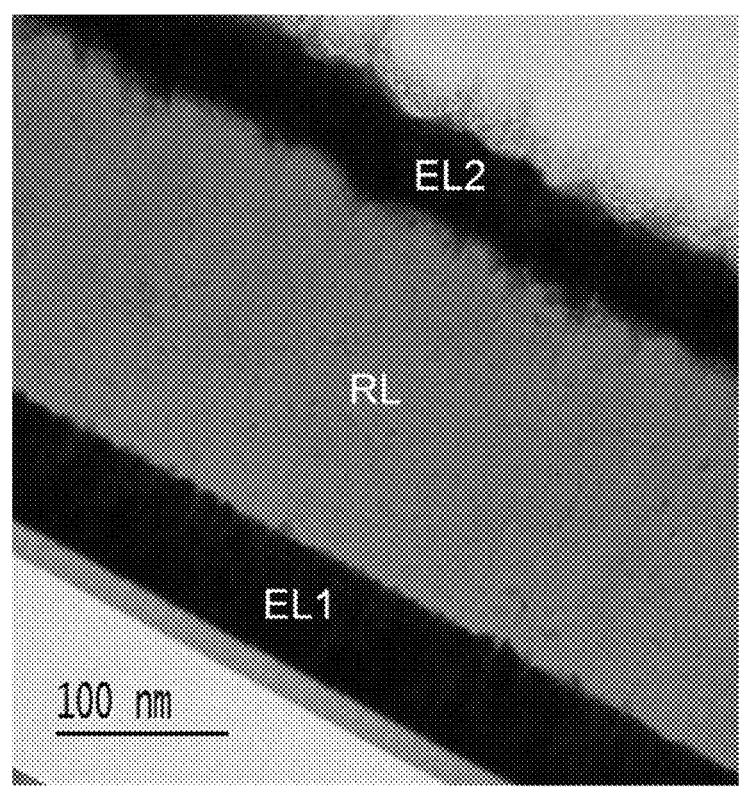
FIG. 4A to FIG. 4D are transmission electron microscope (TEM) images showing a cross section of a switching device having a tellurium-doped matrix structure according to an embodiment of the present invention.

Referring to FIG. 4A, a switching device SD includes a lower electrode EL1 and an upper electrode EL2. The switching film RL disposed between the lower electrode EL1 and the upper electrode EL2 includes a matrix MX containing antimony oxide doped with tellurium, and the thickness of the switching film RL is approximately 230 nm.

Figure 4B:
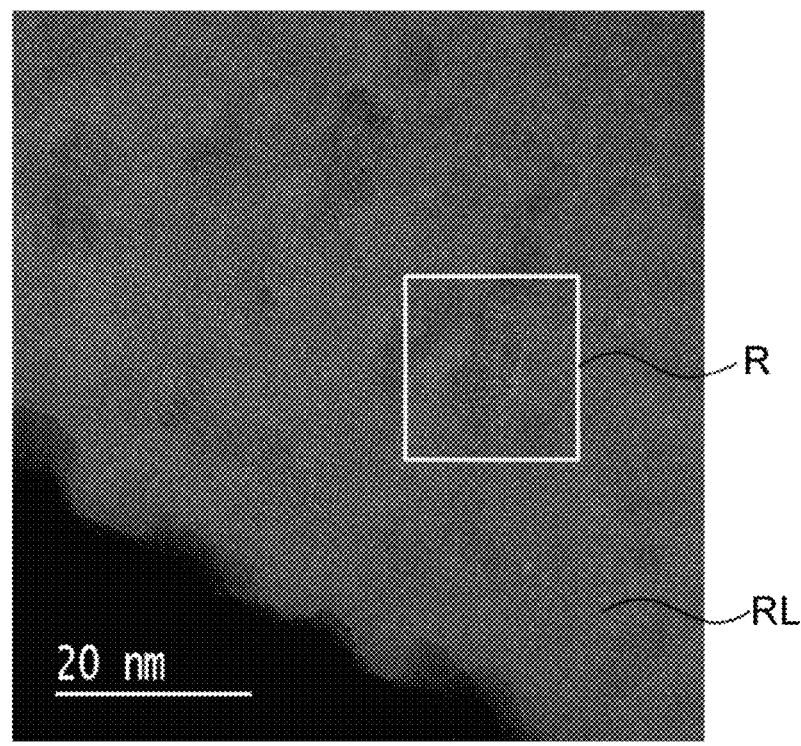
Figure 4C:
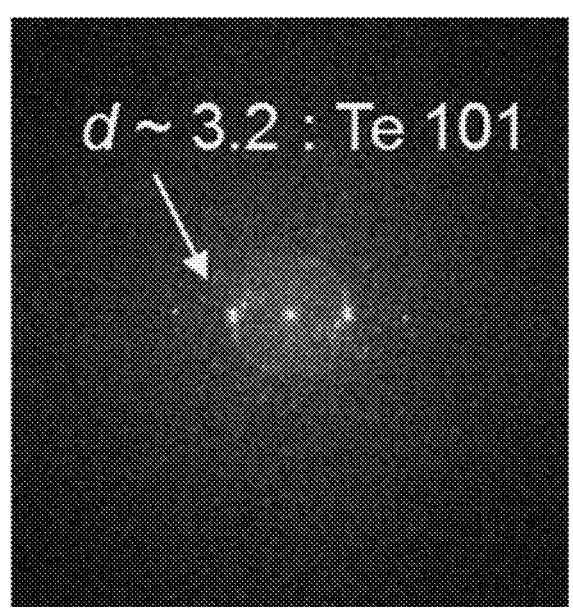
Figure 4D:
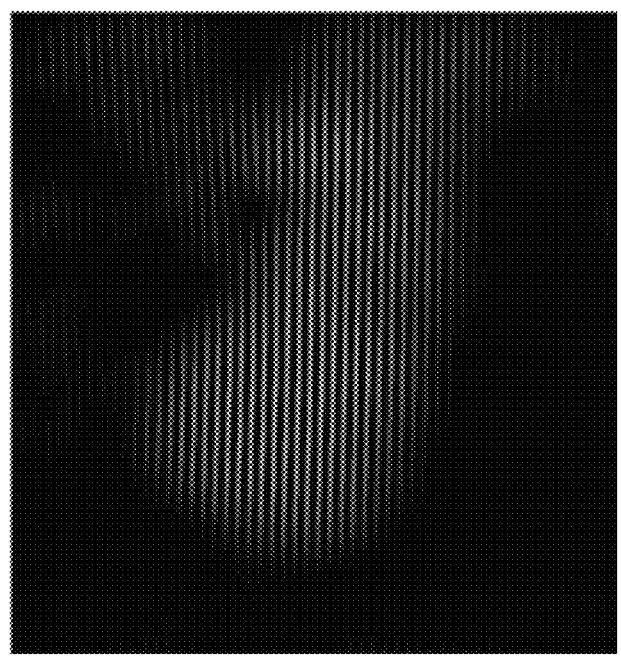

Referring to FIG. 4B, it can be observed that tellurium clusters TC are dispersedly formed in the matrix MX. One such tellurium cluster is present in the enlarged region R of the switching film RL. These tellurium clusters TC are locally formed in the switching film RL and have crystalline properties. Referring to FIGS. 4C and 4D, analytical results confirm that the tellurium dusters have a (101) orientation plane with an inter-planar distance of 3.2 Å.

Figure 5:
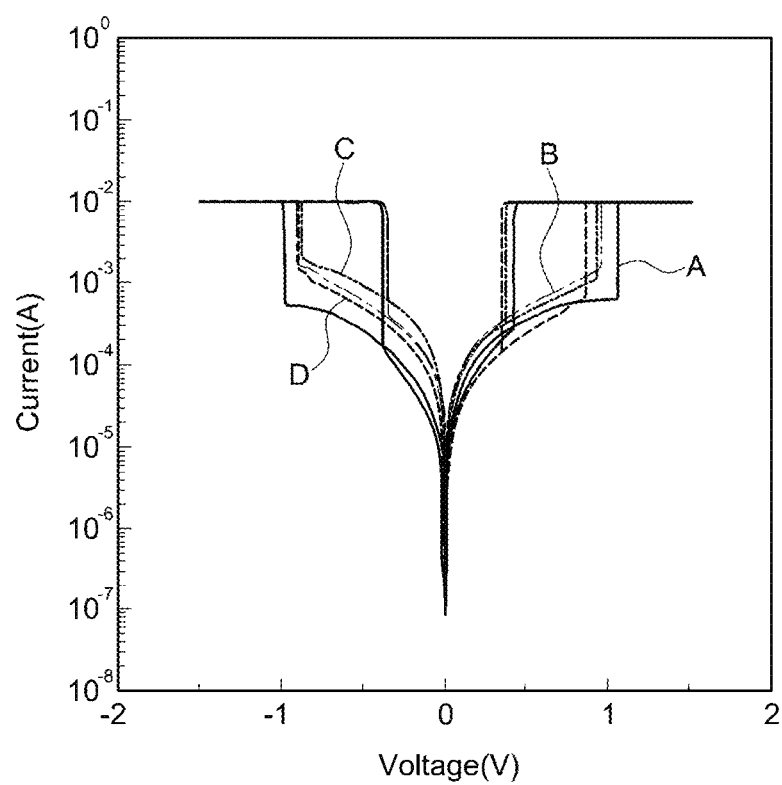
FIG. 5 is a graph showing current-voltage characteristics according to an electrode area of a switching device according to an embodiment of the present invention.

FIG. 5 is a graph showing the current-voltage characteristics of an electrode area of the switching device SD according to an embodiment of the present invention.

The electrical characteristics shown in FIG. 5 were collected using a device in which the lower electrode EL1 and the upper electrode EL2 are platinum thin films, and the current-voltage characteristics of switching devices SD having different electrode areas are compared and evaluated.

First of all, for switching device A having an electrode area of 100 μm, it can be seen that the current is increasing while a voltage is increasing, and when the voltage exceeds 1 V corresponding to the threshold voltage, the current increases abruptly. In addition, it can be seen that when a voltage exceeds a threshold voltage of 1V in the switching device B having an electrode area of 80 μm, the switching device C having an electrode area of 60 μm, and the switching device D having an electrode area of 40 μm, the current abruptly increases in these devices. Then, the current abruptly decreases when the voltage is lower than 0.5 V in the on-state. This is because the conductive path formed by the tellurium cluster and the tellurium bridge is locally formed in the switching film RL which implements threshold voltage switching, so there is no dependency of off-current on the electrode area even if the electrode areas are different from each other. In addition, since the switching device SD of the present invention induces an on-current through a conductive path formed by a tellurium cluster and a tellurium bridge, it is possible to provide a switching device SD with a low operating voltage, a high on/off current ratio (Ion/off), and improved cycling or endurance. Further, because threshold voltage switching is implemented using crystalline metal clusters, reproducible threshold voltage switching characteristics may be provided even at high temperatures.

Figure 6:
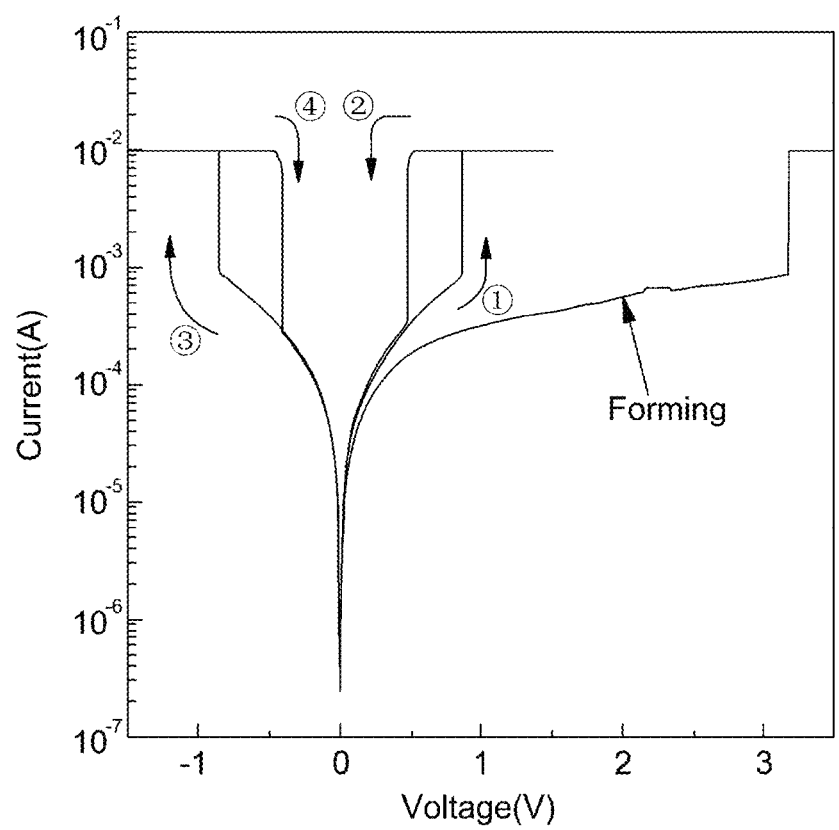
FIG. 6 is a graph illustrating DC characteristics of a switching device according to an embodiment of the present invention.

FIG. 6 is a graph showing DC characteristics of a switching device SD according to an embodiment of the present invention. The switching device SD used in the experiment includes a switching film RL doped with tellurium Te in a matrix MX containing silicon oxide. For example, the switching film RL may be a non-stoichiometric material having a composition ratio of $Te_XSi_YO_Z$ (0<x≤1, 0<Y≤1, 0≤Z≤1).

Referring to FIG. 6, a voltage of 3V is applied to a switching device SD that forms a conductive path in the device. After the conductive path is formed, when a set voltage exceeds 0.9 V, the current increases abruptly (step ①→step ②). This change in conductivity is caused by metal, in this case tellurium, that has migrated through a matrix material to form a conductive path CP Here, the conductive path CP is established by metal bridges MB comprising migrated metal atoms that form connections between coalesced crystalline metal clusters CL.

In addition, FIG. 6 shows that the current abruptly decreases when a reset voltage is applied. When a reset voltage exceeding 0.9 V is applied, the current decreased suddenly (step ③→④). This is because the tellurium bridge TB constituting the conductive path CP formed in the switching film RL of the switching device SI) is locally broken and accordingly, the conductive path CP is broken. In particular, the reset voltage causes the metal atoms of the metal bridges to withdraw, thereby eliminating conductive paths CP between the crystalline metal clusters in the matrix.

Figure 7A:
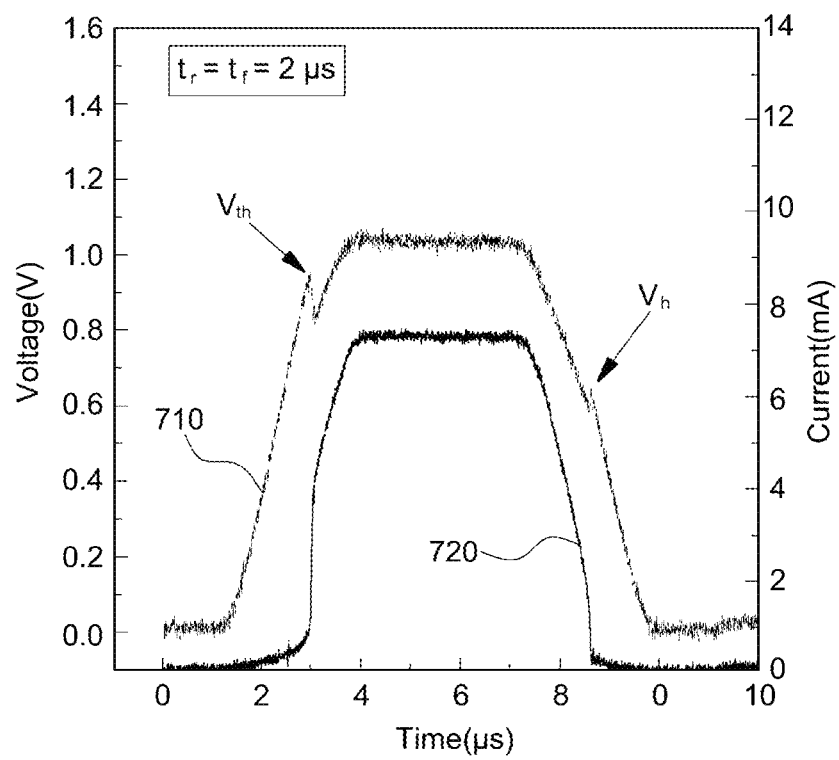
FIG. 7A is a graph showing characteristics of a switching device according to an embodiment of the present invention in response to a current pulse.
Figure 7B:
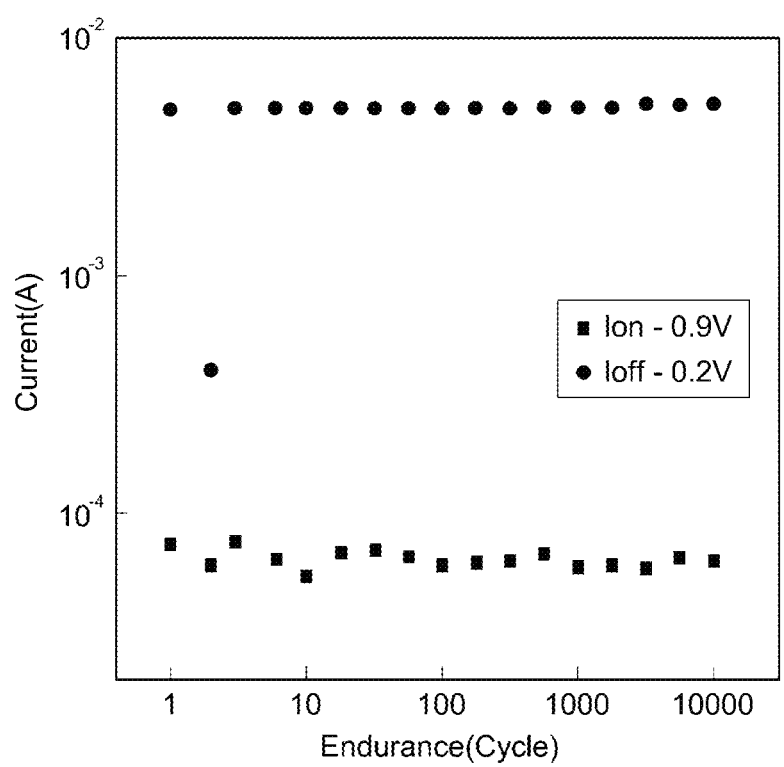
FIG. 7B is a graph showing endurance of the switching device.
Figure 7C:
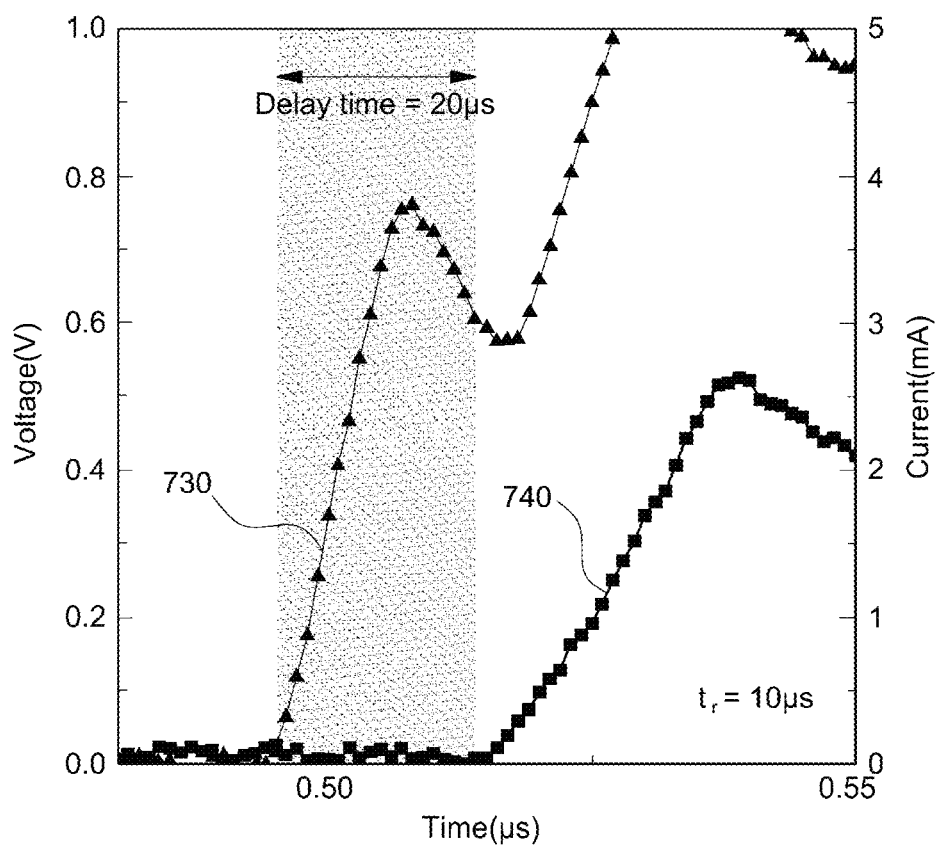
FIG. 7C is a graph showing a delay time for voltage-current of the switching device.

FIG. 7A is a graph showing pulse characteristics of a switching device SD according to an exemplary embodiment of the present invention. FIG. 7B is a graph showing the endurance of the switching device SD, and FIG. 7C is a graph showing delay time characteristics for voltage and current of the switching device SD according to an embodiment of the present invention. The switching device SD used in the experiment is a switching film with a silicon nitride matrix doped with tellurium having a composition of $Te_{0.29}Si_{0.31}N_{0.23}O_{0.17}$, which is within a range of $Te_XSi_YN_Z$, (0<x≤1, 0<Y≤1, 0≤Z≤1).

Referring to FIG. 7A, when the voltage pulse signal (710, an input signal of the pulse generator) of the switching device SD and the current characteristics curve (720, an output signal of the switching device) are compared with each other, the current increases in accordance with an increase of the input voltage pulse value in the switching device SD. When the pulse voltage exceeds the threshold voltage $V_{TH}$, the current rapidly increases to in a low resistance state, or on-state. When the applied voltage is reduced to the sustaining voltage $V_h$ or lower, the current abruptly decreases the due to a transition to a high resistance state, or off-state.

Referring to FIG. 7B, the threshold voltage switching performance of the switching device SD was evaluated by repeatedly applying a switch-on voltage of 0.9 V and a switch-off voltage of 0.2 V to measure endurance of the switching device. It can be confirmed that the select device SD according to an embodiment of the present invention maintains high endurance even up to $10^4$ cycles.

In some embodiments, a switching device may have a ratio of on current to off current of 10 or more, or a ratio of 100.

FIG. 7C illustrates current 730 and voltage 740 measurements over time from applying voltage 730 to the switching device SD and. In the switching device SD, it was observed that the current was sensed within about 20 μs after the voltage was applied, and accordingly has a very small delay characteristic. Therefore, the delay between when a voltage is applied and when current flows for embodiments of the present invention are relatively low, resulting in a memory with excellent response characteristics.

As explained with reference FIG. 7A to 7C, according to an embodiment of the present invention, the tellurium clusters TC and the tellurium bridge TB form a locally conductive path in the switching film RL. Therefore, a switching device having stabilized current characteristics, improved switching endurance, and an excellent on-current/off-current ratio and response characteristics.

Figure 8A:
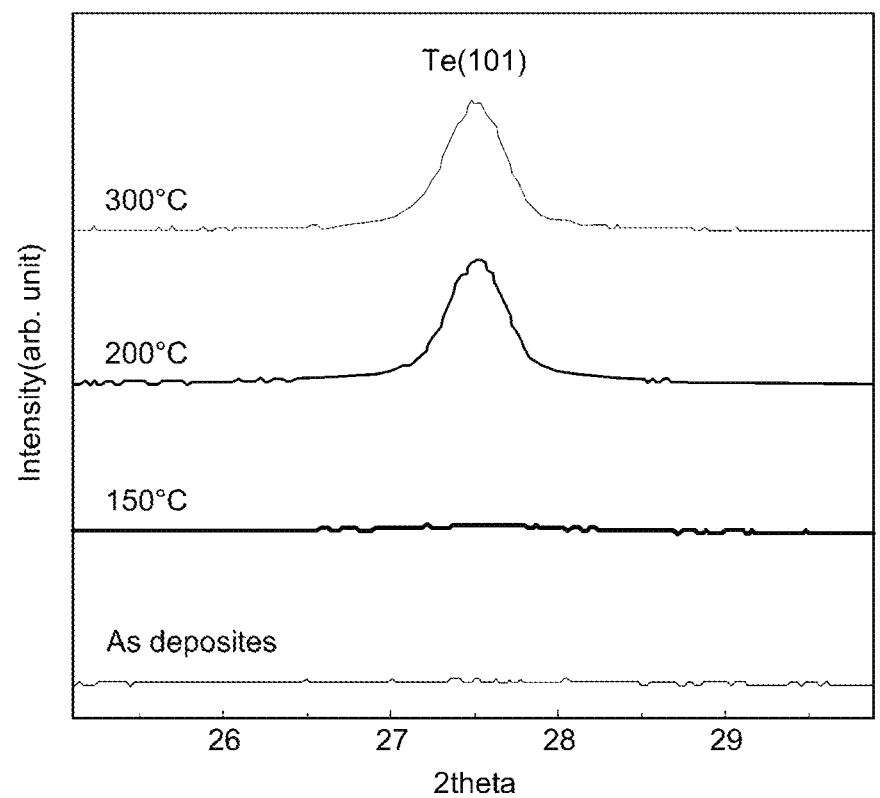
FIG. 8A is a graph showing the results of X-ray diffraction analysis of the switching device according to the present invention.
Figure 8B:
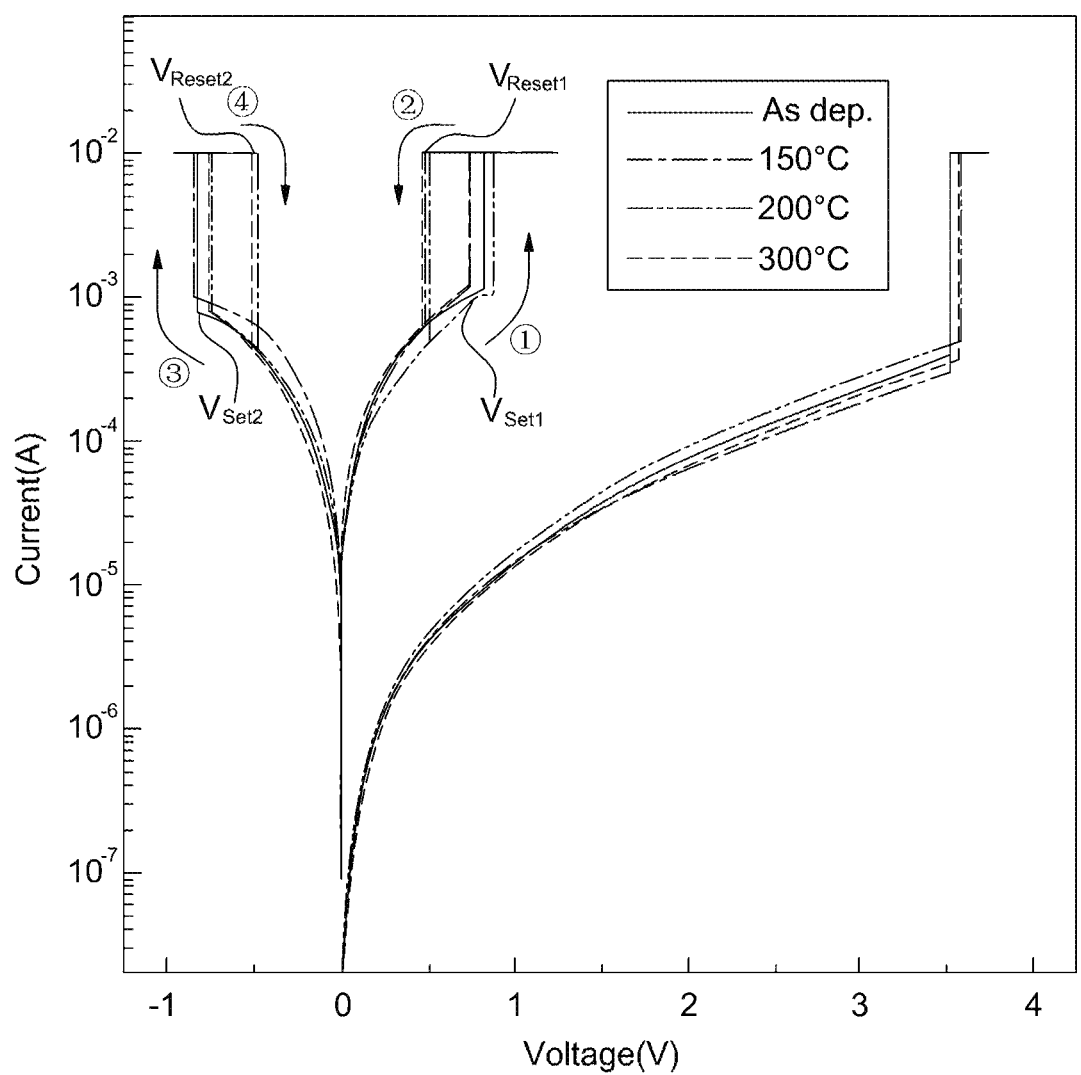
FIG. 8B is a graph showing a change in switching operation characteristics according to a heat treatment temperature of the switching device.
Figure 8C:
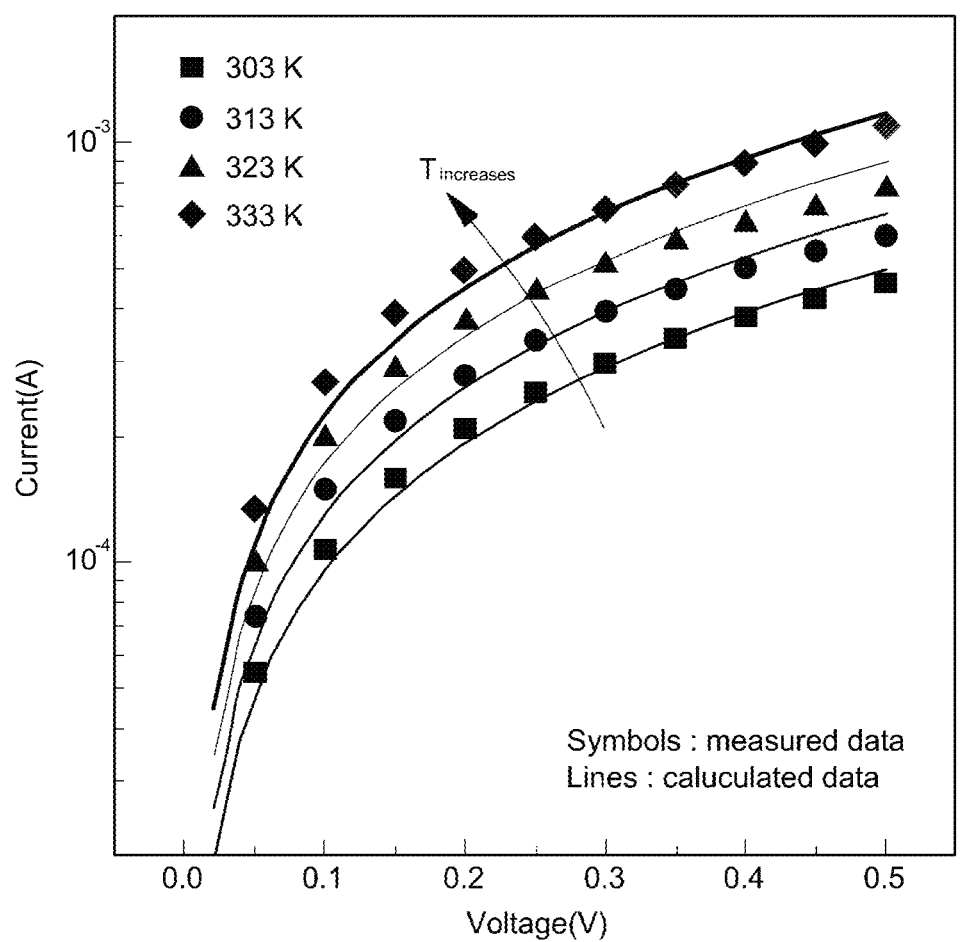
FIG. 8C is a graph showing changes of an off-current according to measured temperatures of the switching device.

FIG. 8A is a graph showing the results of X-ray diffraction analysis of a switching device SD according to the present invention. FIG. 8B is a graph showing changes in switching characteristics according to the heat treatment temperature of the switching device SD. FIG. 8C is a graph showing off-current change according to the measurement temperature of the switching device SD.

FIG. 8A shows that when heat treatment is performed within the range of 200° C. and 400° C. belonging to the temperature range of 180° C. to 400° C. according to the embodiment of the present invention, tellurium clusters having a (101) preferred orientation plane was formed with respect to the switching film RL of the switching device SD. The results from heat treatment at 150° C. fail to establish crystallization of the tellurium clusters.

FIG. 8B illustrates a set operation (step 1→Step 2) and a reset operation (step 3→Step 4) may be stably performed even when a heat-treatment was applied at a high temperature of 150° C., 200° C., and 300° C., and the set voltages $V_{SET1}$ and $V_{SET2}$ and the reset voltages $V_{RESET1}$ and $V_{RESET2}$ was almost not changed, as compared with the switching element RL of As-dep. state. Therefore, according to the embodiment of the present invention, since the threshold voltage switching characteristic is realized by the conductive path CP based on the crystallized tellurium clusters TC and the tellurium bridge TB connecting between the crystallized tellurium clusters TC, typical thermal instability appearing in a heat treatment during the device fabricating processes, or in the device operations in a conventional chalcogenide-based switching device, are reduced or suppressed, so that a switching device having an excellent thermal stability property may be provided.

FIG. 8C demonstrates that the off-current increases in the switching device element SD as temperature increases. It is presumed that when a carrier (for example, electrons or holes) is trapped along the formed conductive path, the off-current increases while the difference between the conduction band energy $E_C$ and the Fermi energy $E_F$ is being reduced. Assuming that a conductive mechanism according to a trap-limited conduction model is employed, a current value in the subthreshold region may be calculated by the following equation 1. The $E_C$-$E_F$ value extracted from Equation 1 may be obtained from the I-V measurement result according to the measured temperature, and has a value of approximately 0.274 eV.

Since the measured value of the off-current is almost identical to the value calculated by the trap-limited conduction model, the prediction based on the trap-limited conduction model is consistent with the threshold voltage switching characteristic of the switching device of the present invention. However, the model concerning such a conductive mechanism is only exemplary, and the present invention is not limited by such a model.

$$I = 2qAN_{T,tot}\frac{\Delta z}{\tau_0}e^{-(E_C-E_F)/kT}\sinh\left(\frac{qV_A}{kT}\frac{\Delta z}{2u_a}\right) \quad [\text{equation 1}]$$

Here, I, q, A, $N_T$, tot, $\Delta Z$, $\tau 0$, k, $V_A$ and $u_a$ are defined as a current, a charge amount, a device area, and integral of a trap distribution in a gap on the Fermi level, a distance between the traps, characteristics of the escape attempt time for the trapped electrons, the Boltzmann constant, an applied voltage and a thickness of the matrix, respectively.

As previously explained with reference to FIG. 8A-FIG. 8D, according to an embodiment of the present invention, a switching device having a conductive path formed by a crystallized tellurium clusters TC and a tellurium bridge TB connecting them has a stable threshold voltage switching operation, a high on/off current ratio (Ion/off), and can withstand elevated temperatures.

Figure 9:
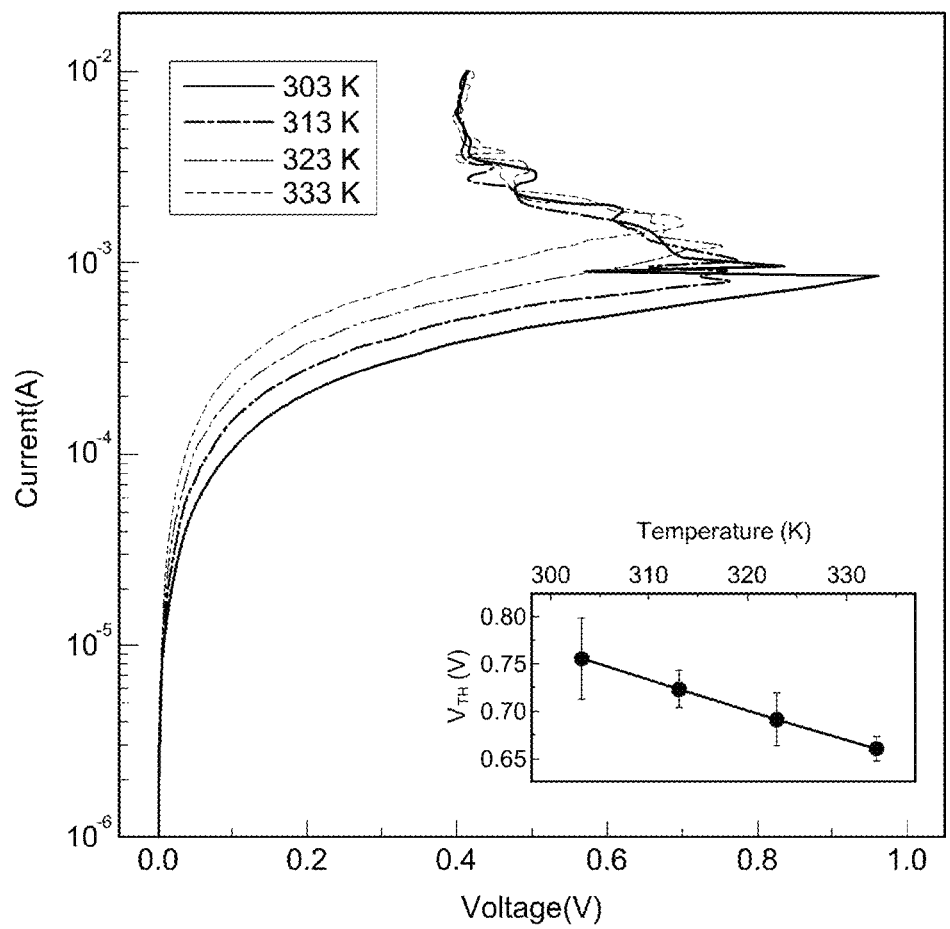
FIG. 9 is a graph showing voltage snapback according to measured temperature of a switching device and a change in a threshold voltage calculated therefrom according to an embodiment of the present invention.

FIG. 9 is a graph showing voltage snapback at each of the measured temperatures of the switching device SD according to an embodiment of the present invention, and changes in threshold voltage calculated therefrom.

FIG. 9 illustrates that the threshold voltage of a switching device SD according to an exemplary embodiment of the present invention decreases as the temperature increases. It is presumed that the threshold voltage decreases in order to satisfy the power for reaching the critical point because the off-current increases as the temperature increases.

The present invention described in the foregoing paragraphs is not limited to the above-mentioned embodiments and accompanying drawings. Further, it will be apparent to those skilled in the art that various changes, substitutions, and alterations may be made within the scope of this disclosure.

What is claimed is:

1. A switching device coupled in series to a variable resistor that stores logic values by changing a resistance state, the switching device being a selection element in which on-current flows when a voltage is applied in a set state and on-current does not flow when the voltage is applied in a reset state, the switching device comprising,
a first electrode;
a second electrode; and
a switching film disposed between the first electrode and the second electrode, the switching film having an electrically insulating matrix and a conductive path formed in the electrically insulating matrix;
wherein the conductive path includes crystalline metal clusters dispersed in the electrically insulating matrix and a metal bridge connecting adjacent crystalline metal clusters, and the crystalline metal clusters have a crystal orientation plane.

2. The switching device according to claim 1, wherein the metal bridge has an amorphous structure.

3. The switching device according to claim 1, wherein the metal bridge provides a trap-limited conduction mechanism within the electrically insulating matrix.

4. The switching device according to claim 1, wherein the crystallin:
metal clusters and the metal bridge comprise tellurium.

5. The switching device according to claim 1, wherein the electrically insulating matrix includes an oxide material, a nitride material, or a combination thereof, and
wherein the oxide material or the nitride material is an oxide or nitride of a metal, a metalloid or a non-metal element.

6. The switching device according to claim 5, wherein the metal, the metalloid or the non-metal element of the electrically insulating matrix is thermodynamically more difficult to alloy with constituent metals of the crystalline metal clusters than coalescence or agglomeration of the constituent metals of the crystalline metal clusters.

7. The switching device according to claim 1, wherein the electrically insulating matrix includes silicon oxide, silicon nitride, antimony oxide, or a combination thereof.

8. The switching device according to claim 1, wherein the electrically insulating matrix includes silicon oxide, and the switching film has a composition ratio according to Formula 1:

$\text{Te}_X\text{Si}_Y\text{O}_Z$ (0<X≤1, 0<Y≤1, 0≤Z≤1). [Formula 1]

9. The switching device according to claim 1, wherein the electrically insulating matrix includes silicon nitride, and the switching film has a composition ratio according to Formula 2:

$\text{Te}_X\text{Si}_Y\text{N}_Z$ (0<X≤1, 0<Y≤1, 0≤Z≤1) [Formula 2]

10. The switching device according to claim 1, wherein the electrically insulating matrix includes antimony oxide, and the switching film has a composition ratio according to Formula 3:

$\text{Te}_X\text{Sb}_Y\text{O}_Z$ (0<X≤10, 0<Y≤10, 0≤Z≤10). [Formula 3]

11. The switching device according to claim 1, wherein a concentration of the metal constituting the metal clusters and the metal bridge in the switching film is from 20 at. % to 30 at. %.

12. The switching device according to claim 1, wherein a thickness of the switching film is from 80 nm to 400 nm.

13. The switching device according to claim 1, wherein the switching film has a conductive mechanism based on trap-limited conduction.

14. The switching device according to claim 1, wherein at least any one of the first electrode and the second electrode includes titanium (Ti), tantalum (Ta), copper (Cu), aluminum (Al), nickel (Ni), platinum (Pt), palladium (Pd), or rhodium (Rh), tungsten (W), silicon (Si), TiN, TaN, WSix, NiSix, CoSix, or TiSix.

15. A non-volatile memory device comprising:
the switching device according to claim 1; and
a non-volatile memory element electrically connected in series to the switching device, the non-volatile memory element being the variable resistor.

16. A switching device coupled in series to a variable resistor that stores logic values by changing a resistance state, the switching device being a selection element in which on-current flows when a voltage is applied in a set state and on-current does not flow when the voltage is applied in a reset state, the switching device comprising,
a first electrode;
a second electrode; and
a switching film disposed between the first electrode and the second electrode, the switching film having an electrically insulating matrix and a conductive path formed in the electrically insulating matrix;
wherein the conductive path includes crystalline metal clusters dispersed in the electrically insulating matrix and a metal bridge connecting adjacent crystalline metal clusters, the crystalline metal clusters have a crystal orientation plane and the metal bridge has an amorphous structure, and
wherein the crystalline metal clusters and the metal bridge consist of tellurium.

* * * * *